United States Patent [19]

Okanobu

[11] Patent Number: 4,581,593

[45] Date of Patent: Apr. 8, 1986

[54] VARIABLE FREQUENCY OSCILLATING CIRCUIT

[75] Inventor: Taiwa Okanobu, Tokyo, Japan

[73] Assignee: Sony Corporation, Tokyo, Japan

[21] Appl. No.: 606,605

[22] Filed: May 3, 1984

[30] Foreign Application Priority Data

May 25, 1983 [JP] Japan .................................. 58-92066
May 30, 1983 [JP] Japan .................................. 58-95354

[51] Int. Cl.⁴ .............................................. H03B 5/30
[52] U.S. Cl. ............................ 331/116 R; 331/117 R; 331/167; 331/176
[58] Field of Search ........... 331/107 R, 108 R, 116 R, 331/117 R, 117 D, 167, 176

[56] References Cited

U.S. PATENT DOCUMENTS 3,986,145 10/1976 Hongu et al. ................ 331/116 R X
4,306,198 12/1981 Okada ......................... 331/116 R X Primary Examiner—Eugene R. LaRoche
Assistant Examiner—Robert J. Pascal
Attorney, Agent, or Firm—Lewis H. Eslinger; Alvin Sinderbrand

[57] ABSTRACT

A variable frequency oscillating circuit of the general Colpitts kind in which the frequency of oscillation varies in accordance with the current in a constant current source and oscillation stability is high because the oscillator is of the general LC form. Resonance is provided by a solid-state resonator driving a transistor forming the Colpitts oscillator and which is connected to ground through a constant current source having a controllable current to set the frequency of oscillation. The response characteristic can be linearized using a compensating circuit employing additional constant current sources and current mirror circuits.

20 Claims, 7 Drawing Figures

VARIABLE FREQUENCY OSCILLATING CIRCUIT

BACKGROUND OF THE INVENTION

1. Field of the Invention

The present invention relates generally to variable frequency oscillating circuits and, more particularly, to a variable frequency oscillating circuit embodied as a semiconductor integrated circuit and not requiring a variable capacitance diode.

2. Description of the Prior Art

In general, variable frequency oscillating circuits whose frequency of oscillation can be controlled by an input voltage or input current are typically referred to as voltage controlled oscillators (VCO) or current controlled oscillators (CCO). Such VCO's and CCO's are then further roughly classified either as being of the inductance and capacitor (LC) oscillatory kind or as being of the multivibrator oscillatory kind.

Generally, a variable frequency oscillating circuit of the LC kind employs a variable capacitance diode as the resonance element, and a control voltage is supplied thereto and varied to control the oscillatory frequency of the circuit. In the case of the variable frequency oscillating circuit of the multivibrator kind, the frequency of oscillation is varied by controlling the charge/discharge current of the multivibrator feedback capacitor, that is, by controlling the triggering threshold level.

Nevertheless, if the variable frequency oscillating circuit is of the LC kind and its variable capacitance diode is an ultra-stage junction type one, the cost of manufacturing such variable frequency oscillating circuit increases substantially compared with a variable frequency oscillating circuit using an ordinary variable capacitance diode. Moreover, a variable capacitance diode formed as an ultra-stage junction is not easy to fabricate along with the other necessary circuit elements on the same semiconductor, integrated circuit chip and, accordingly, such variable frequency oscillating circuit is not suitable for forming as an integrated circuit (IC). Furthermore, when a diode of the ordinary PN junction kind is employed, its variable capacitance range is so narrow that the range of frequency variation that is possible in the variable frequency oscillator is also similarly restricted.

The variable frequency oscillating circuit of the multivibrator kind also has drawbacks because of oscillatory instability, which results in only a VCO or a CCO having poor carrier-to-noise (C/N) ratio being able to be practically constructed. Accordingly, a variable frequency oscillating circuit of the multivibrator kind cannot provide the same or better efficiency as a variable frequency oscillator of the LC kind.

OBJECTS AND SUMMARY OF THE INVENTION

Accordingly, it is an object of the present invention to provide an improved variable frequency oscillating circuit that avoids the drawbacks inherent in the prior art.

It is another object of the present invention to provide a variable frequency oscillating circuit that can provide a wide range of frequency variation, without using discrete circuit elements, such as variable capacitance diodes.

It is still another object of the present invention to provide a variable frequency oscillating circuit having good oscillation stability and an excellent carrier-to-noise ratio.

It is a further object of the present invention to provide a variable frequency oscillating circuit having a correcting circuit employing an exponential function characteristic of a transistor to correct a control signal so that the control signal versus oscillatory frequency characteristic is linear.

It is a still further object of the present invention to provide a variable frequency oscillating circuit having a minimum number of circuit elements and which can be advantageously embodied as a semiconductor integrated circuit.

It is yet a further object of the present invention to provide a variable frequency oscillating circuit suitable for use as an element in a phase-locked-loop (PLL) circuit.

According to one aspect of the present invention a variable frequency oscillator is provided of the general Colpitts kind, in which the resonance frequency thereof is varied by varying the current in a constant current source, thereby making a current controlled oscillator. By making the oscillator in the general LC form, the stability of oscillation is made high, and the carrier-to-noise ratio is quite acceptable. The variable frequency oscillator includes a resonating circuit and an inverting amplifier, in which a feedback capacitor is connected between an output of the inverting amplifier and the inverting input thereof and a resistor shunts the inverting input to ground. The output signal of the inverting amplifier is fed to the resonator as the resonance capacitance thereof, and the magnitude of a current from a constant current source is varied to thereby vary the frequency of oscillation of the circuit.

The above, and other objects, features, and advantages of the present invention will become apparent from the following detailed description of illustrated embodiments thereof to be read in conjunction with the accompanying drawings, in which like reference numerals designate the same elements and parts.

DETAILED DESCRIPTION OF PREFERRED EMBODIMENTS

Figure 1:
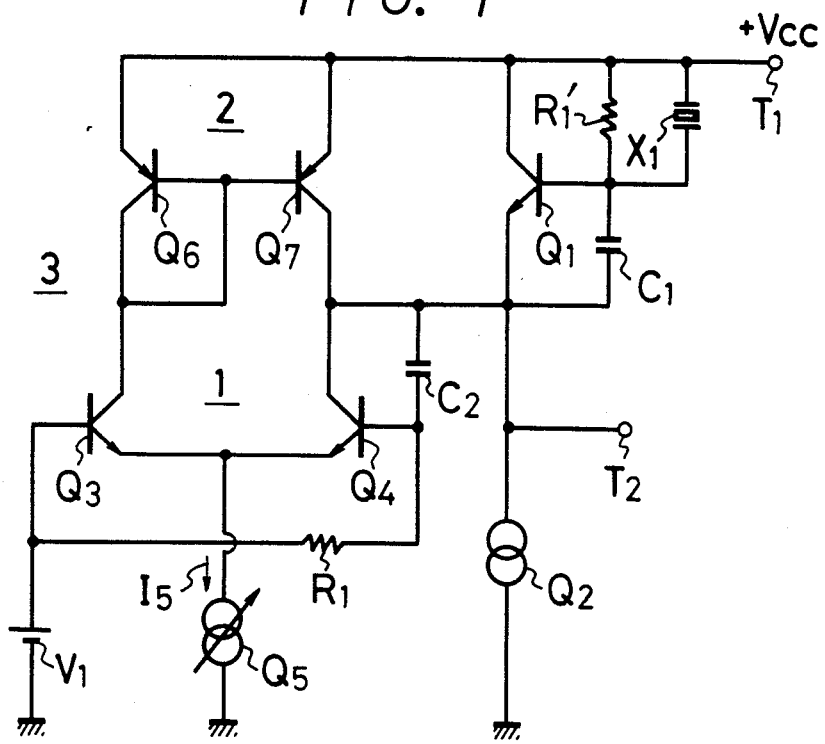
FIG. 1 is a schematic diagram of an embodiment of a variable frequency oscillating circuit according to the present invention.

In the embodiment of the variable frequency oscillating circuit according to the present invention shown in FIG. 1, the collector of transistor $Q_1$ is connected to a power source terminal $T_1$, to which is connected the bias voltage conventionally referred to as $V_{cc}$. A constant current source conventionally represented as $Q_2$ is connected between the emitter lead of transistor $Q_1$ and ground potential. Connected between the base and collector leads of transistor $Q_1$ is a resistor $R_1'$ and a solid-state resonator $X_1$ mutually connected in parallel, and a capacitor $C_1$ is arranged between the base lead and the emitter lead of transistor $Q_1$. The output of this oscillating circuit is taken off at terminal $T_2$ connected to the emitter of transistor $Q_1$, and differential amplifier 1 is also connected to the emitter of transistor $Q_1$. Specifically, differential amplifier 1 is formed of transistors $Q_3$ and $Q_4$ whose emitters are connected in common in the conventional fashion, with the common emitters being connected to ground potential through constant current source $Q_5$, which is of the kind in which the current is controllable or selectable. Current mirror circuit 2 of the conventional kind is formed of transistors $Q_6$ and $Q_7$, the emitters of which are connected together to the bias voltage $V_{cc}$ at terminal $T_1$, and the bases of which are connected together in the conventional fashion. The base and collector leads of transistor $Q_6$ are tied together to form a diode. Differential amplifier 1 and current mirror circuit 2 arranged in this configuration form an inverting amplifier, in which the collectors of transistors $Q_3$ and $Q_4$ are connected, respectively, to the collectors of transistors $Q_6$ and $Q_7$, thereby forming inverting amplifier 3. This inverting amplifier has a feedback capacitor $C_2$ connected from the base lead of transistor $Q_4$ to the collector lead thereof, which is also connection point of current mirror circuit 2 to differential amplifier 1. Also at this same connection point the emitter lead of transistor $Q_1$ is connected to the collector lead of transistor $Q_4$. Bias voltage for differential amplifier 1 is provided by voltage source $V_1$, which is connected between the base lead of transistor $Q_3$ and ground potential and is further connected through resistor $R_1$ to the base lead of transistor $Q_4$.

Figure 2:
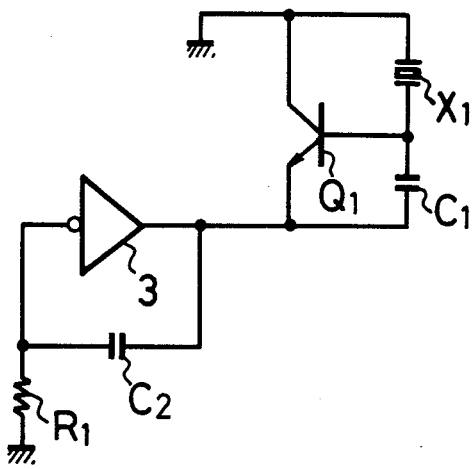
FIG. 2 is an alternating current equivalent circuit of the variable frequency oscillating circuit of FIG. 1.

In the above described circuit, inverting amplifier 3, formed of differential amplifier 1 and current mirror circuit 2, operates with the base connection of transistor $Q_4$ as the inverting input terminal, and the junction of collector leads of transistors $Q_4$ and $Q_7$ as the output terminal, so that an alternating current equivalent circuit of the variable frequency oscillating circuit of FIG. 1 is represented in FIG. 2. Referring then to FIG. 2, inverting amplifier 3 is supplied with negative feedback through capacitor $C_2$ and this inverting input terminal of inverting amplifier 3 is shunted to ground by resistor $R_1$, and the output terminal of inverting amplifier 3 is connected to the emitter lead of transistor $Q_1$, to which the output terminal $T_2$ is also connected.

The measure of how readily alternating current will flow in the circuit of FIG. 1 is represented by the output admittance (Y) of inverting amplifier 3, which can be expressed as:

$$Y = \frac{\omega^2 C_2^2 R_1}{1 + (\omega C_2 R_1)^2} ([q/2kT]R_1 I_5 + 1) + \frac{j\omega C_2}{1 + (\omega C_2 R_1)^2} ([q/2kT]R_1 I_5 + 1) \qquad (1)$$

where $\omega$ represents angular frequency, q/kT represents Boltzmann's constant, and $I_5$ represents the constant current from constant current source $Q_5$, which has a selectable or controllable constant current. This admittance may be seen to be the equivalent of a series circuit formed of a resistor and a capacitor, that is, the real portion and the imaginary portion (j) of the admittance, and the Q of the capacitance portion thereof may be expressed as:

$$Q = 1/\omega C_2 R_1 \qquad (2)$$

where Q is a figure of merit of a resonant system indicating the rate of decay of the stored energy. Thus, if the relationship that Q is much much greater than 1 can be established, then the admittance Y can be regarded as being composed only of the capacitance. Then an equivalent capacitance $C_x$ thereof may be expressed as:

$$C_x = C_2 ([q/2kT]R_1 I_5 + 1) \qquad (3)$$

Figure 3:
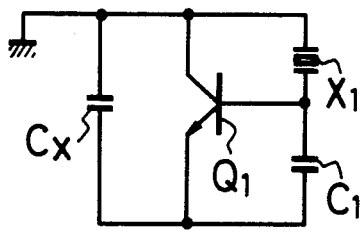
FIG. 3 is a further alternating current equivalent circuit of the equivalent circuit of FIG. 2.

In other words, inverting amplifier 3 when viewed from the emitter side of transistor $Q_1$ can be regarded simply as capacitance $C_x$. Consequently, the equivalent circuit of FIG. 2 can be further reduced to that represented in FIG. 3, as the Colpitts type oscillating circuit which oscillates at a resonant frequency determined by the inductance of the solid state resonator $X_1$ and the two capacitances $C_1$ and $C_x$. It should be recalled that a Colpitts oscillator is one in which a parallel tuned tank circuit has two voltage dividing capacitors connected in series, with the common capacitor connection being connected to the emitter circuit of the transistor, or to the cathode in an electron-tube embodiment.

Examining the equivalent capacitance $C_x$ as represented in equation (3) above, it is seen that the equivalent capacitance $C_x$ can be varied in response to the magnitude of current $I_5$; as a result, the circuit of FIG. 1 is seen to be a Colpitts oscillating circuit, and the frequency of oscillation thereof is controlled by varying the constant current $I_5$ produced by current source $Q_5$. This results in creating a current controlled oscillator (CCO) without resorting to the use of certain disadvantageous circuit elements, such as variable capacitance diodes of the ultra-stage junction kind. Moreover, the equivalent capacitance $C_x$, as expressed by equation (3) hereinabove, can be varied over a substantial range, thereby increasing the range of frequencies possible at the output of the oscillating circuit of FIG. 1. Also, because this current controlled oscillator is of the fundamental LC oscillation kind, the stability of oscillation is high and the carrier-to-noise ratio is excellent, while at the same time requiring a relatively small number of circuit elements to assemble. Furthermore, because no DC current flows between the emitter of transistor $Q_1$ and the common collectors of transistors $Q_4$ and $Q_7$, the potential at those points is determined solely by transistor $Q_1$ and, thus, power source $V_{cc}$ can be held at a low level. In addition, since the output terminal of inverting amplifier 3 is connected to the emitter circuit of transistor $Q_1$, it is possible to increase the level of the oscillatory signal at the emitter of transistor $Q_1$. This would not be the case if the input terminal of inverting amplifier 3 is connected to transistor $Q_1$.

Figure 4:
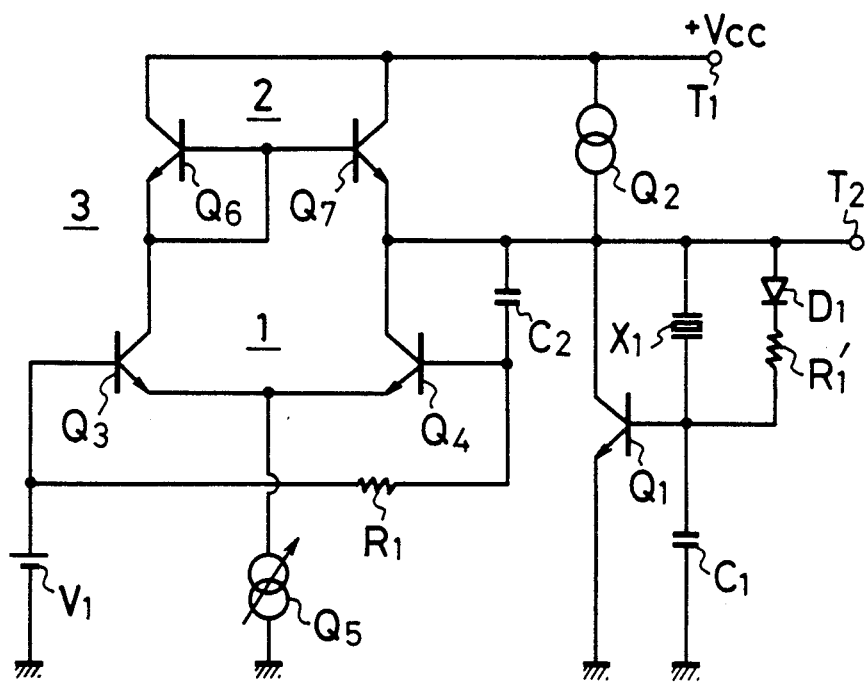
FIG. 4 is a schematic diagram of a second embodiment of a variable frequency oscillating circuit according to the present invention.

FIG. 4 represents a schematic of another embodiment of a variable frequency oscillating circuit according to the present invention, in which the emitter circuit of transistor $Q_1$ is connected directly to ground potential. In this embodiment, a second constant current source $Q_2$ is connected between terminal $T_1$ of bias voltage $V_{cc}$ and the output terminal of inverting amplifier 3. Also connected at the point between constant current source Q₂ and the output of inverting amplifier 3 is the collector lead of transistor $Q_1$, which has its emitter connected directly to ground potential. The solid state resonator $X_1$ is connected between the collector circuit and base circuit of transistor $Q_1$ and a series circuit formed of diode $D_1$ and resistor $R_1'$ is connected in parallel with the solid state resonator $X_1$. The output signal is again taken off at terminal $T_2$, which in this embodiment is connected to the collector lead of transistor $Q_1$. The same variable frequency of oscillation control as in the preceding embodiment can be achieved using this embodiment. That is, a Colpitts oscillator is constructed without using variable capacitance diodes or the like. It is, of course, understood that in both embodiments shown in FIGS. 1 and 4, in place of solid state resonator $X_1$ an inductance coil could be connected between the base and collector circuits of transistor $Q_1$.

Figure 5:
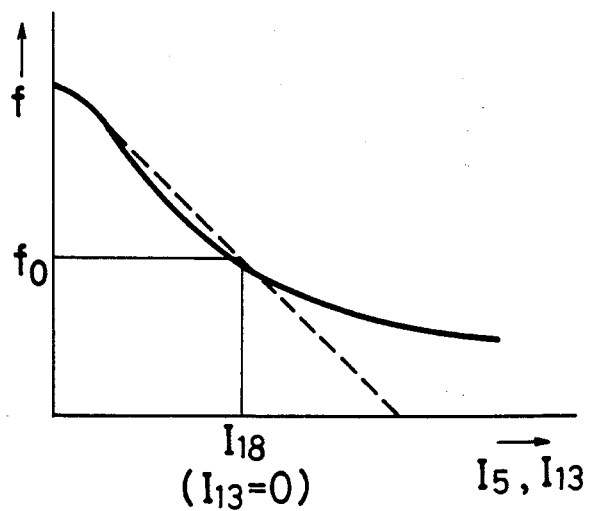
FIG. 5 is a graph showing a control signal versus oscillatory frequency characteristic useful in explaining the present invention.
Figure 6:
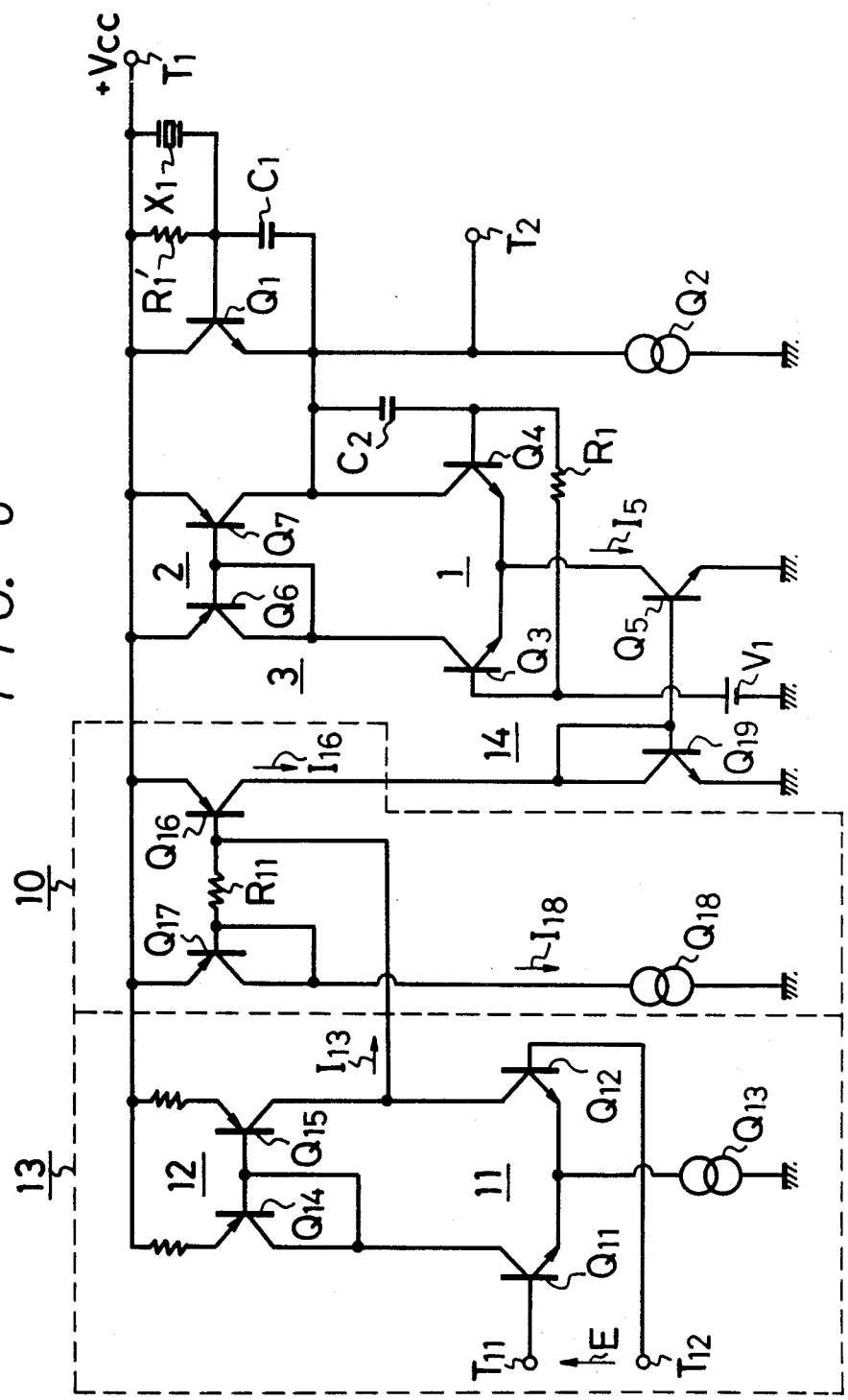
FIG. 6 is a schematic diagram showing a third embodiment of a variable frequency oscillating circuit according to the present invention.

In the current controlled oscillators in the embodiments described hereinabove relative to the circuits of FIGS. 1 and 4, the equivalent capacitance $C_x$ is expressed by equation (3), and the capacitance $C_x$ is varied linearly relative to variations in current $I_5$. Thus the oscillatory frequency f relative to current $I_5$ varies nonlinearly, as represented by the solid line in FIG. 5. As a result, in a range where the oscillatory frequency f is high, the control sensitivity for the oscillatory frequency f is similarly high, whereas in a range where the oscillatory frequency f is low, control sensitivity thereof is also low, so that such variable frequency oscillating circuit becomes difficult to put into practice. Additionally, when such current controlled oscillator is used in a phase-locked-loop (PLL), the loop gain of the PLL is changed considerably due to the oscillatory frequency f, so that it become impossible to establish the characteristics in such PLL circuit. FIG. 6 represents a further embodiment of a variable frequency oscillating circuit according to the present invention, in which a correction circuit 10 is provided that utilizes the exponential function characteristic of a transistor to correct the control current $I_5$, so that the control signal versus oscillatory frequency characteristic is made substantially linear.

In the embodiment of FIG. 6, in place of the general representation of the constant current source $Q_5$, a specific embodiment is set forth and, specifically, control current $I_5$ flows through the collector-emitter path of transistor $Q_5$. Additionally, control signal supply circuit 13 is provided that is formed of a noninverting amplifier which comprises differential amplifier 11 and current mirror circuit 12. Differential amplifier 11 is of the conventional configuration and includes transistors $Q_{11}$ and $Q_{12}$, having their respective emitters commonly connected to ground potential through constant current source $Q_{13}$. The base circuits of transistors $Q_{11}$ and $Q_{12}$ are available at terminals $T_{11}$ and $T_{12}$, respectively, to which can be connected a control voltage E. Current mirror circuit 12 is of the conventional kind and consists of transistors $Q_{14}$ and $Q_{15}$ having emitters connected commonly through respective resistors to bias voltage $V_{cc}$ at terminal $T_1$, and in which the base lead and collector lead of transistor $Q_{14}$ are connected to form a diode. In this embodiment of FIG. 6, the respective collector circuits of transistors $Q_{11}$ and $Q_{12}$, which form differential amplifier 11, are connected to the respective collector circuits of transistors $Q_{14}$ and $Q_{15}$, which form current mirror circuit 12.

Nonlinearity correcting circuit 10 includes transistors $Q_{16}$ and $Q_{17}$ having their base leads commonly connected through resistor $R_{11}$ and emitter leads connected to bias voltage $V_{cc}$, and which thereby form a current mirror circuit. Transistor $Q_{17}$ has its base and collector leads tied together so as to be the functional equivalent of a diode and constant current source $Q_{18}$ is connected in the collector lead of transistor $Q_{17}$ to ground potential.

Current mirror circuit 14 is connected to linearity correcting circuit 10 so that the current flowing through the emitter-collector circuit transistor $Q_{16}$, that is, current $I_{16}$, flows into the current mirror circuit 14. Specifically, current mirror circuit 14 includes transistor $Q_{19}$ having the base and collector circuits connected together in the diode configuration, with the emitter lead thereof connected directly to ground potential and the base lead of transistor $Q_{19}$ connected to the base lead of transistor $Q_5$, through which current $I_5$ flows from the common-emitter circuit of differential amplifier 1.

In the operation of the embodiment of FIG. 6, control voltage E is applied across terminals $T_{11}$ and $T_{12}$ in such a way so that the potential at terminal $T_{11}$ is positive relative to the other terminal, thus, the current $I_{13}$ flowing from the collector circuit of transistor $Q_{12}$ into the nonlinearity correction circuit 10 will be greater than zero. On the other hand, the current $I_{13}$ flowing into the nonlinearity correction circuit 10 will be less than zero when the control voltage E is such so that terminal $T_{12}$ is relatively positive. In addition, due to the operation of differential amplifier 11, the current $I_{13}$ flowing into correction circuit 10 will be zero when the control voltage E is zero. Thus, a direct relationship is demonstrated between control current $I_{13}$ and control voltage E.

If the base current flowing in the current mirror circuit formed of transistors $Q_{16}$ and $Q_{17}$ is considered to be negligible, the respective base-emitter voltages of transistors $Q_{16}$ and $Q_{17}$ and current $I_{13}$ can be represented as follows:

$$V_{BE17} - I_{13} R_{11} = V_{BE16} \tag{4}$$

Thus, the collector current $I_{16}$ flowing out of nonlinearity correction circuit 10 from the collector circuit of transistor $Q_{16}$ may be represented as:

$$I_{16} \approx I_s \left( \exp\left[ \frac{q}{kT} \right] \{V_{BE17} - I_{13}R_{11}\} \right) \tag{5}$$

where $I_s$ represents the saturation current of transistor $Q_{16}$ of nonlinearity correction circuit 10. Because this collector current $I_{16}$ of transistor $Q_{16}$ is equal to the collector current of transistor $Q_{19}$ and because transistors $Q_{19}$ and $Q_5$ comprise the current mirror circuit 14, then the current $I_5$ will equal current $I_{16}$ and:

$$I_5 \approx I_s \left( \exp\left[ \frac{q}{kT} \right] \{V_{BE17} - I_{13}R_{11}\} \right) \tag{6}$$

Thus, when $I_{13}$ equals zero, which is the situation when control voltage E equals zero, then the collector current $I_5$, represented as $I_5(0)$, will be:

$$I_5(0) \approx I_s \left\{ \exp\left(\frac{q}{kT}\right) V_{BE17} \right\} \quad (7)$$

Accordingly, based on equations (6) and (7) the current $I_5$ may be represented as:

$$\frac{I_5(0)}{I_5} \approx \frac{I_s\left\{ \exp\left(\frac{q}{kT}\right) V_{BE17} \right\}}{I_s\left\{ \exp\left(\frac{q}{kT}\right) (V_{BE17} - I_{13}R_{11}) \right\}} \quad (8)$$

$$= \exp\left(\frac{q}{kT}\right) I_{13}R_{11} \quad (9)$$

Thus, relative to current $I_{13}$, it is seen that current $I_5$ varies exponentially from the reference current $I_5(0)$. Accordingly, the frequency of oscillation f will vary linearly with the current $I_{13}$, as represented by the dashed line of FIG. 5.

When the control voltage E is zero and current $I_{13}$ equals zero, collector current $I_{16}$ of transistor $Q_{16}$ in nonlinearity correction circuit 10 will equal the collector current of transistor $Q_{17}$ in the current mirror, which in turn is equal to the constant current $I_{18}$ provided by constant current source $Q_{18}$ and, accordingly, $I_5$ will equal $I_{18}$. As a result of this, the frequency of oscillation f is equal to a reference frequency $f_0$.

From the above, it can be seen that following the present invention it is possible to make the frequency of oscillation f vary linearly relative to a control voltage E or the resultant control current $I_{13}$. Also, because a nonlinearity response characteristic of the frequency of oscillation is corrected by using the exponential function characteristic of a transistor, there is little fluctuation of the control signal versus the oscillatory frequency characteristic. Accordingly, regardless of the frequency of oscillation f, it is possible to obtain constant control sensitivity and, because in a phase-lock-loop circuit, which is intended for use with the present invention, the loop gain thereof is constant, it becomes relatively easy to obtain the desired characteristic.

Figure 7:
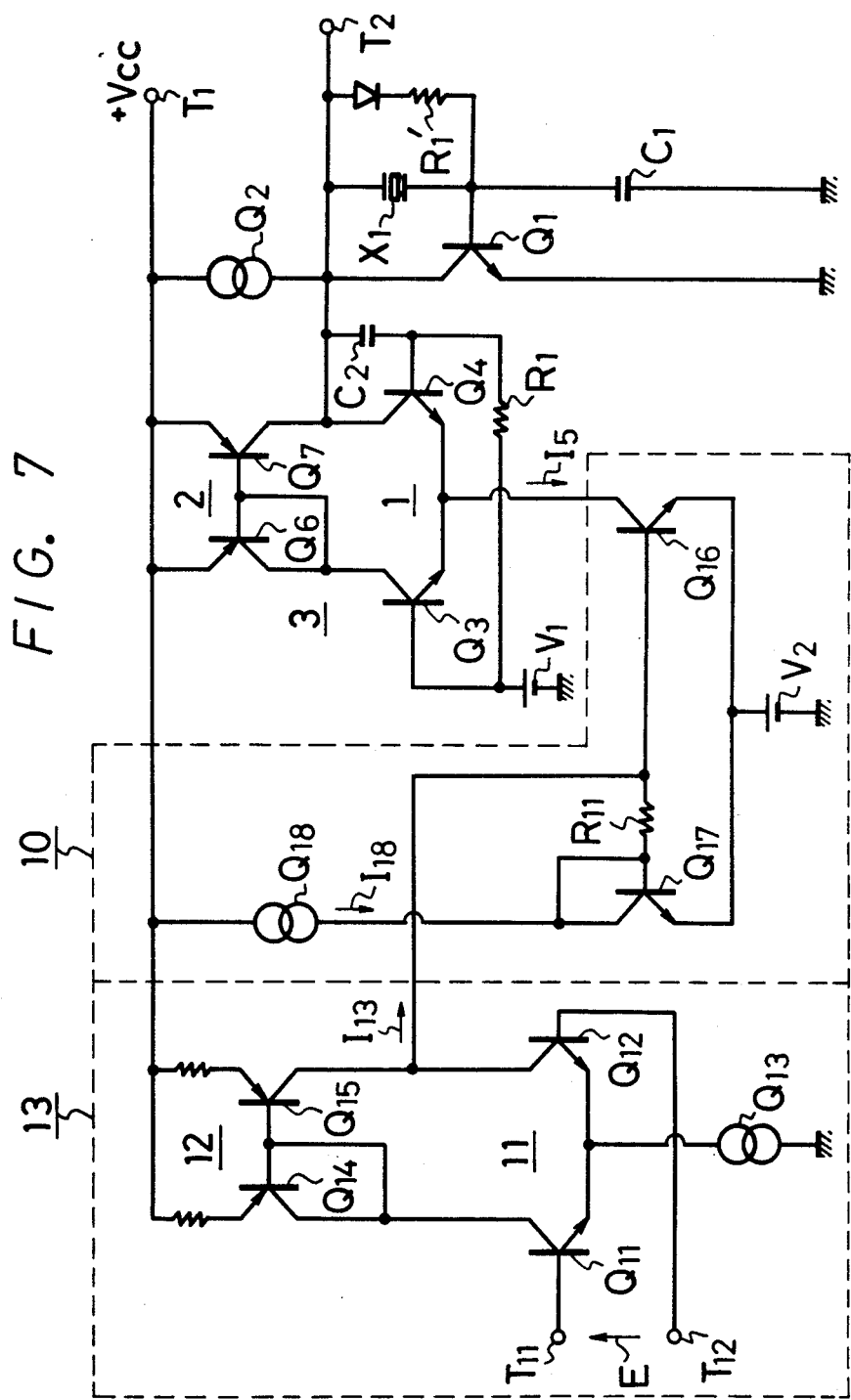
FIG. 7 is a schematic diagram showing a fourth embodiment of a variable frequency oscillating circuit according to the present invention.

In the embodiment of FIG. 7, a variable frequency oscillating circuit has the nonlinearity correction feature as in the embodiment of FIG. 6; specifically, nonlinearity correcting circuit 10 and control signal supply circuit 13 are connected to a variable frequency oscillator, similar to that shown in FIG. 4. In this embodiment, the current mirror circuit 14 employed in the embodiment of FIG. 6 is eliminated, thereby decreasing the number of circuit elements required and providing an attendant manufacturing cost savings. More particularly, in the embodiment of FIG. 7, constant current source $Q_{18}$ is connected between the bias voltage $V_{cc}$ at terminal $T_1$ and the collector circuit of transistor $Q_{17}$, which is connected as a diode. Again, the collector circuit of transistor $Q_{16}$ is connected directly to the common emitters of transistors $Q_3$ and $Q_4$, which form differential amplifier 1. Also, the emitter circuits of transistors $Q_{16}$ and $Q_{17}$ are connected together and to one terminal of a bias voltage source $V_2$ the other terminal of which is connected to ground potential. This embodiment functions substantially identically to that of FIG. 6; however, note that the current mirror circuit formed of transistors $Q_5$ and $Q_{19}$ is eliminated and the collector lead of transistor $Q_{16}$ is connected directly to differential amplifier 1.

In the embodiments of the variable frequency oscillating circuit according to the present invention, as shown for example in FIGS. 1, 4, 6, and 7 hereinabove, the elements other than the solid-state resonator $X_1$ and the bias voltage sources $V_1$ and $V_2$ may be readily formed as semiconductor integrated circuits.

Although illustrative embodiments of the present invention have been described in detail above with reference to the accompanying drawings, it is to be understood that the invention is not limited to those precise embodiments, and that various changes and modifications can be effected therein by one skilled in the art without departing from the scope or spirit of the invention, as defined by the appended claims.

What is claimed is:

1. Apparatus for generating an alternating current signal of controllable frequency, comprising:
   oscillator means having a frequency of oscillation variable in response to a control signal;
   inverting amplifier means;
   complex impedance means connected to feedback an output of said inverting amplifier to a respective inverting input thereof and to shunt said inverting input for controlling current flow through said inverting amplifier means; and
   said output of said inverting amplifier comprising said control signal and being connected to said oscillator means whereby frequency of oscillation of said oscillator means varies in response to the current flow through said amplifier means.

2. Apparatus for generating an alternating current signal according to claim 1, in which said complex impedance means comprises a resistor shunting said inverting input terminal of said inverting amplifier and a feedback capacitor connected between said output of said inverting amplifier and said inverting input terminal of said inverting amplifier.

3. Apparatus for generating an alternating current signal according to claim 1, in which said inverting amplifier means comprises a differential amplifier having a constant current source connected between amplifying elements of said differential amplifier and relative ground potential and a current mirror circuit connected between said amplifying elements of said differential amplifier and a bias voltage, wherein the flow of current through said constant current source can be varied to select a predetermined current flow through said differential amplifier.

4. Apparatus for generating an alternating current signal according to claim 1, in which said oscillator means comprises a parallel-tuned tank circuit including a transistor and two voltage-dividing capacitors in series, with their common connection connected to an emitter circuit of said transistor and said output of said inverting amplifier being available at said emitter circuit of said transistor.

5. Apparatus for generating an alternating current signal according to claim 1, in which said complex impedance means comprises a resistor connected to shunt said inverting input of said inverting amplifier and a feedback capacitor connected between said output and respective inverting input of said inverting amplifier; said inverting amplifier comprises a differential amplifier having a constant current source of controllable current connected between the amplifying elements of said differential amplifier and ground potential and a current mirror circuit connected between said amplifying elements of said differential amplifier and a bias voltage; and in which said oscillator means comprises a parallel tuned tank circuit to which is connected said control voltage from said differential amplifier and said current mirror circuit.

6. Apparatus for generating an alternating current signal according to claim 1, in which said oscillator means comprises a Colpitts oscillator formed of a transistor and having a solid-state resonating element connected in a feedback path thereof, and in which said inverting amplifier means and said complex impedance means comprise one of two voltage dividing capacitors connected in series forming said Colpitts oscillator.

7. Apparatus for generating an alternating current signal according to claim 1, further comprising nonlinearity correction circuit means connected to said inverting amplifier for providing a nonlinearity correction to said current flow therethrough.

8. Apparatus for generating an alternating current signal according to claim 7, further comprising a supply signal circuit producing a supply signal fed to said nonlinearity correction circuit for controlling the extent of said nonlinearity correction.

9. Apparatus for generating an alternating current signal of controllable frequency, comprising:
oscillator means having a frequency of oscillation variable in response to a control signal;
inverting amplifier means;
complex impedance means connected to feed back an output of said inverting amplifier to a respective inverting input thereof and to shunt said inverting input for controlling current flow through said inverting amplifier means;
said output of said inverting amplifier comprising said control signal and being connected to said oscillator means whereby frequency of oscillation of said oscillator means varies in response to the current flow through said amplifier means;
nonlinearity correction circuit means connected to said inverting amplifier for providing a nonlinearity correction to said current flow therethrough; and
a supply signal circuit producing a supply signal fed to said nonlinearity correction circuit for controlling the extent of said nonlinearity correction;
said nonlinearity circuit comprising a transistor and a diode, the emitter of the transistor being connected to the anode of said diode, and the connection point thereof being connected to a reference potential, the base of said transistor being connected to the cathode of said diode through a resistor and a constant current source connected between said cathode of said diode and a ground potential, in which a collector current of said transistor is supplied to said differential amplifier as its constant current source, and in which said supply signal circuit produces a control current fed to the connection point between said transistor and said resistor in said nonlinearity correcting circuit to control the extent of said nonlinearity correction.

10. Apparatus for generating an alternating current signal according to claim 9, in which said supply signal circuit comprises a second differential amplifier, each amplifying element thereof being connected to receive a relative control voltage for controlling the extent of said supply signal.

11. A current controlled oscillator producing an output signal of controllable frequency, comprising:
an oscillating circuit having a resonance portion;
a differential amplifier;
a constant current source connected to said differential amplifier;
a current mirror circuit connected to said differential amplifier and thereby forming an inverting amplifier;
a feedback capacitor connected between an output terminal of said inverting amplifier and an input terminal thereof;
a resistor connected to shunt said inverting input terminal of said inverting amplifier and
means for connecting said output terminal of said inverting amplifier to said resonance portion of said oscillating circuit to constitute a resonance capacitance thereof, and wherein the magnitude of the constant current in said constant current source is varied to control the frequency of oscillation of said oscillating circuit in response thereto.

12. A current controlled oscillator according to claim 11, in which said oscillating circuit comprises an oscillator of the Colpitts configuration having a transistor in a parallel tuned tank circuit and a solid-state resonating element in the feedback path thereof and in which said means for connecting said output terminal of said inverting amplifier is connected to the emitter circuit of said transistor.

13. A current controlled oscillator according to claim 11, in which said oscillating circuit comprises an oscillator of the Colpitts configuration having a transistor in a parallel tuned tank circuit and a solid-state resonating element in the feedback path thereof, and in which said output of said inverting amplifier is connected to the emitter circuit of said transistor and said emitter circuit is connected to ground potential through a second constant current source, wherein said output signal of controllable frequency is available at said emitter circuit of said transistor.

14. A current controlled oscillator according to claim 11, in which said oscillating circuit comprises a transistor Colpitts oscillator in which said output terminal of said inverting amplifier is connected to a collector circuit of said transistor and said collector circuit is connected to a bias voltage through said constant current source and wherein said output signal of controllable frequency is available at said collector circuit.

15. A current controlled oscillator according to claim 12, further comprising nonlinearity correction circuit means connected to said input of inverting amplifier for correcting a nonlinearity in said control current.

16. A current controlled oscillator producing an output signal of controllable frequency, comprising:
an oscillator of Colpitts configuration having a transistor in a parallel tuned tank circuit and a solid-state resonating element in the feedback path thereof;
a differential amplifier;
a constant current source connected to said differential amplifier;
a current mirror circuit connected to said differential amplifier and thereby forming an inverting amplifier;
a feedback capacitor connected between an output terminal of said inverting amplifier and an input terminal thereof;

a resistor connected to shunt said inverting input terminal of said inverting amplifier;

means connected to the emitter circuit of said transistor for connecting said output terminal of said inverting amplifier to said resonance element to form a resonance capacitance thereof, the magnitude of the constant current in said constant current source being varied to control the frequency of oscillation of said oscillating circuit in response thereto;

nonlinearity correction circuit means connected to the input of said inverting amplifier for correcting a nonlinearity in said control circuit;

a control supply signal circuit, said nonlinearity correction circuit comprising a transistor and a diode, the emitter of said correction circuit transistor and the anode of said correction circuit diode being connected to a reference voltage point and the base of said correction circuit transistor being connected to the cathode of said correction circuit diode through a correction circuit resistor, and a second constant current source connected to said cathode of said correction circuit diode, the collector current of said correction circuit transistor being supplied to said inverting amplifier as its constant current source, and said control supply signal circuit producing a control current fed to a connection point between said correction circuit transistor and said correction circuit resistor to vary the supply signal fed to said nonlinearity correction circuit.

17. Apparatus for generating an alternating current signal of controllable frequency, comprising:

oscillator means having a variable frequency of oscillation in response to a control signal fed thereto;

inverting amplifier means producing said control signal in response to a current flow therethrough;

complex impedance means connected to feedback an output of said inverting amplifier means to a respective inverting input thereof and to shunt said inverting input;

nonlinearity correction circuit means connected to said inverting amplifier means for controlling the extent of current flow therethrough in response to a supply signal; and control supply circuit means connected to receive a control voltage for producing said supply signal fed to said nonlinearity correction circuit means for controlling the nonlinearity of the current flow therethrough.

18. Apparatus for generating an alternating current signal according to claim 17, in which said control supply circuit means comprises a differential amplifier connected to a source of bias potential through a current mirror circuit and in which the input terminals of said amplifying elements of said differential amplifier are connected to receive said control voltage.

19. Apparatus for generating an alternating circuit signal, comprising:

oscillator means having a variable frequency of oscillation in response to a control signal fed thereto;

inverting amplifier means producing said control signal in response to current flow therethrough;

complex impedance means connected to feed back an output of said inverting amplifier means to a respective inverting input thereof and to shunt said inverting input;

nonlinearity correction circuit means connected to said inverting amplifier means for controlling the extent of current flow therethrough in response to a supply signal; and control supply circuit means comprising a differential amplifier connected to a source of bias potential through a current mirror circuit and in which the input terminals of the amplifying elements of said differential amplifier are connected to receive said control voltage, said control supply voltage fed to said nonlinearity correction circuit means for controlling the nonlinearity of the current flow therethrough, and said nonlinearity correction circuit means comprising a transistor and a diode, the base circuit of the transistor being connected through a resistor to the cathode of said diode, in which the output signal from said control supply circuit means is connected to the connection point of said resistor and said base circuit of said transistor, in which the anode of said diode is connected through a constant current source to relative ground potential, and in which the collector current of said transistor is fed to said inverting input of said inverting amplifier means.

20. Apparatus for generating an alternating current signal according to claim 19, in which said inverting amplifier means comprises a second differential amplifier connected to a ground potential through a current mirror circuit and in which said nonlinearity correcting circuit means is connected to a diode of said current mirror circuit.

* * * * *